United States Patent
Jung et al.

(10) Patent No.: US 9,286,983 B2
(45) Date of Patent: Mar. 15, 2016

(54) MEMORY STRING AND SEMICONDUCTOR DEVICE INCLUDING THE SAME

(71) Applicant: SK hynix Inc., Gyeonggi-do (KR)

(72) Inventors: Sung Wook Jung, Gyeonggi-do (KR); Dong Kee Lee, Seoul (KR); Hyun Seung Yoo, Gyeonggi-do (KR); Yu Jin Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 134 days.

(21) Appl. No.: 14/220,976

(22) Filed: Mar. 20, 2014

(65) Prior Publication Data
US 2015/0124530 A1    May 7, 2015

(30) Foreign Application Priority Data

Nov. 1, 2013 (KR) .......................... 10-2013-0132088

(51) Int. Cl.
*G11C 16/04* (2006.01)
*H01L 27/115* (2006.01)

(52) U.S. Cl.
CPC ........ *G11C 16/0483* (2013.01); *H01L 27/1157* (2013.01); *H01L 27/11524* (2013.01); *H01L 27/11556* (2013.01); *H01L 27/11582* (2013.01)

(58) Field of Classification Search
CPC ................ G11C 16/0483; G11C 16/10; G11C 16/3418; G11C 16/26; H01L 27/115
USPC .................................. 365/185.17, 185.18, 184
See application file for complete search history.

(56) References Cited

U.S. PATENT DOCUMENTS

2011/0002172 A1*   1/2011   Kito ................... G11C 16/0483
                                                            365/185.18

FOREIGN PATENT DOCUMENTS

KR          101031699           4/2011

\* cited by examiner

*Primary Examiner* — Jason Lappas
(74) *Attorney, Agent, or Firm* — IP & T Group LLP

(57) ABSTRACT

A memory string includes a pass transistor, first memory cells connected in series to a drain terminal of the pass transistor, and first to $k^{th}$ memory cell groups connected in parallel to a source terminal of the pass transistor and each including a plurality of second memory cells connected in series. Here, 'k' denotes an integer that is equal to or greater than '2'.

7 Claims, 9 Drawing Sheets

MEMORY STRING AND SEMICONDUCTOR DEVICE INCLUDING THE SAME

CROSS-REFERENCE TO RELATED APPLICATION

The present application claims priority to Korean patent application number 10-2013-0132088 filed on Nov. 1, 2013, in the Korean Intellectual Property Office, the entire disclosure of which is incorporated by reference herein.

BACKGROUND

1. Technical Field

Various embodiments of the present invention relate to electronic devices. More specifically, the exemplary embodiments of the present invention relate to memory strings and a semiconductor device including the same.

2. Related Art

A non-volatile memory device is a memory device capable of retaining data stored therein even when power cut-off occurs, and it may include memory strings as a cell array for storing data. Here, each of the memory strings includes a drain selection transistor, a plurality of memory cells, and a source selection transistor that are connected in series. Each of the memory strings is connected to a source line via the source selection transistor, and connected to a bit line via the drain selection transistor.

The memory strings are arranged on a substrate in a horizontal or vertical direction. In the related art, memory strings are arranged on a substrate in the horizontal direction by forming memory cells in a single layer. However, a method of arranging memory strings on a substrate in the vertical direction by stacking memory cells has been suggested.

However, memory strings having the structure described above are limited in increasing cell current. Furthermore, when memory strings are arranged in the vertical direction, the properties of a memory device may be degraded due to interferences between memory cells adjacent in x/y/z-axis direction, respectively.

BRIEF SUMMARY

One or more exemplary embodiments of the present invention are directed to memory strings having improved properties and a semiconductor device including the same.

One aspect of the present invention provides a memory string including a pass transistor, first memory cells connected in series to a drain terminal of the pass transistor, and first to $k^{th}$ memory cell groups connected in parallel to a source terminal of the pass transistor and each including a plurality of second memory cells connected in series, wherein k denotes an integer that is equal to or greater than '2'.

Another aspect of the present invention provides a semiconductor device including first and second memory strings each including a pass transistor, drain-side memory cells connected in series to a drain terminal of the pass transistor, and first and second source-side memory groups connected in parallel to a source terminal of the pass transistor and each including a plurality of source-side memory cells connected in series.

Further aspect of the present invention provides semiconductor device including a first channel layer including a first pipe channel layer, and a first source-side channel layer, a first drain-side channel layer, and a second source-side channel layer connected to the first pipe channel layer and arranged in a first direction, first source-side gates stacked and surrounding the first source-side channel layer, second source-side gates stacked and surrounding the second source-side channel layer, and first drain-side gates stacked and surrounding the first drain-side channel layer, wherein the first source-side gates, the second source-side gates, and the first drain-side gates are separated from one another.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION

Figure 1A:
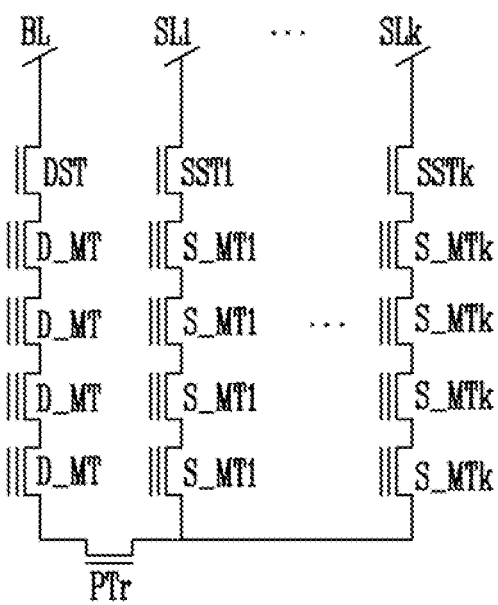
FIG. 1A is a circuit diagram of a memory string according to an exemplary embodiment of the present invention.

The present invention will be described more fully hereinafter with reference to the accompanying drawings, in which exemplary embodiments of the invention are shown. In the drawings, the thicknesses of and distances between elements may be exaggerated for clarity. In the present disclosure, well-known functions or constructions that are not related to the gist of the present invention may not be described. When reference numerals are assigned to the elements shown in the drawings, the same reference numeral is assigned to the same elements even if these elements are illustrated in different drawings.

FIG. 1A is a circuit diagram of a memory string according to an exemplary embodiment of the present invention.

Referring to FIG. 1A, the memory string according to an exemplary embodiment of the present invention includes at least one pass transistor PTr, a plurality of first memory cells connected in series to a drain terminal of the pass transistor PTr, and first to $k^{th}$ memory cell groups connected in parallel to a source terminal of the pass transistor PTr. Here, each of the memory cell groups includes a plurality of second memory cells connected in series. In addition, the first memory cells may be drain-side memory transistors D_MT, and the second memory cells may be source-side memory transistors S_MT1 to S_MTk. Here, 'k' denotes an integer that is equal to or greater than '2'.

The drain-side memory transistors D_MT are connected in series to a drain terminal of the at least one pass transistor PTr.

The first to K$^{th}$ source-side memory transistors S_MT1 to S_MTk are connected in parallel to a source terminal of the at least one pass transistor PTr.

The memory string according to an exemplary embodiment of the present invention further includes a drain selection transistor DST, and first to k$^{th}$ source selection transistors SST1 to SSTk. For example, at least one drain selection transistor DST is connected in series to the drain-side memory transistors D_MT, at least a first source selection transistor SST1 is connected in series to the first source-side memory transistors S_MT1, and at least a k$^{th}$ source selection transistor SSTk is connected in series to the k$^{th}$ source-side memory transistors S_MTk.

Here, the drain selection transistor DST is connected to a bit line BL, the first source selection transistor SST1 is connected to a first source line SL1, and the second source selection transistor SST2 is connected to a second source line SL2.

In the structure described above, one memory string is connected to one bit line BL and a plurality of source lines SL1 to SLk. Thus, the first to k$^{th}$ source-side memory transistors S_MT1 to S_MTk are driven by different source lines SL1 to SLk, respectively. For example, the first source-side memory transistors S_MT1 are driven by the first source line SL1, and the k$^{th}$ source-side memory transistors S_MTk are driven by the k$^{th}$ source line SLk. As described above, the amount of cell current may be increased by connecting the plurality of source lines SL1 to SLk to one memory string.

Figure 1B:
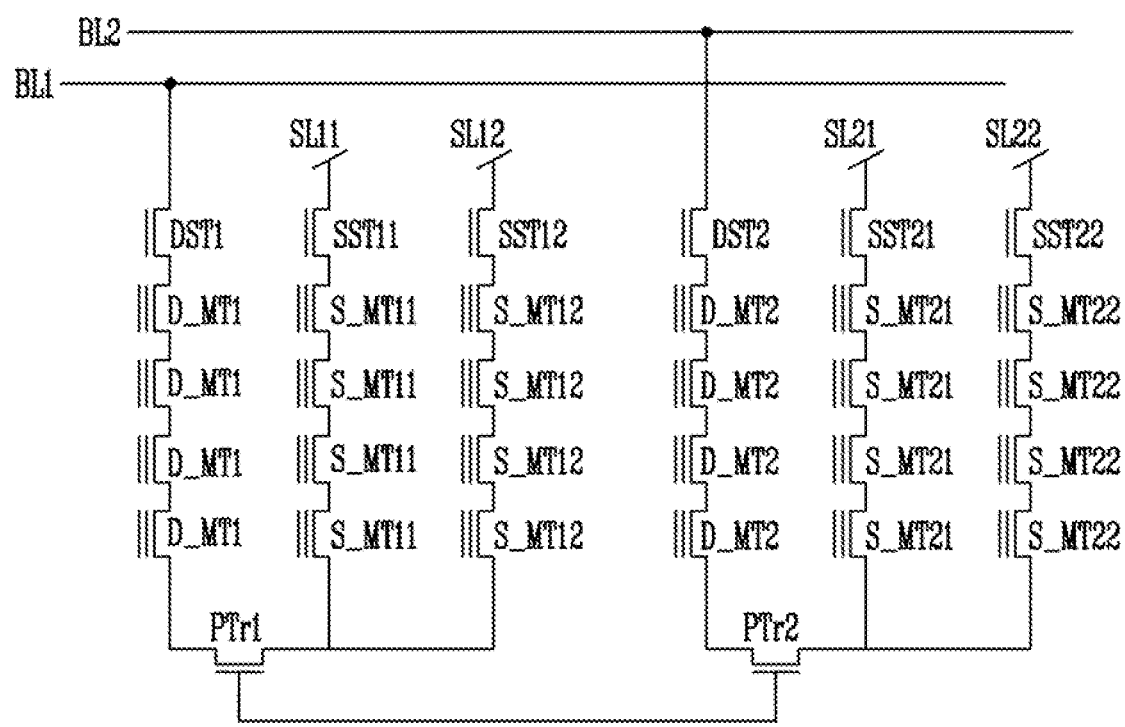
FIGS. 1B and 1C are circuit diagrams illustrating memory strings according to exemplary embodiments of the present invention.
Figure 1C:
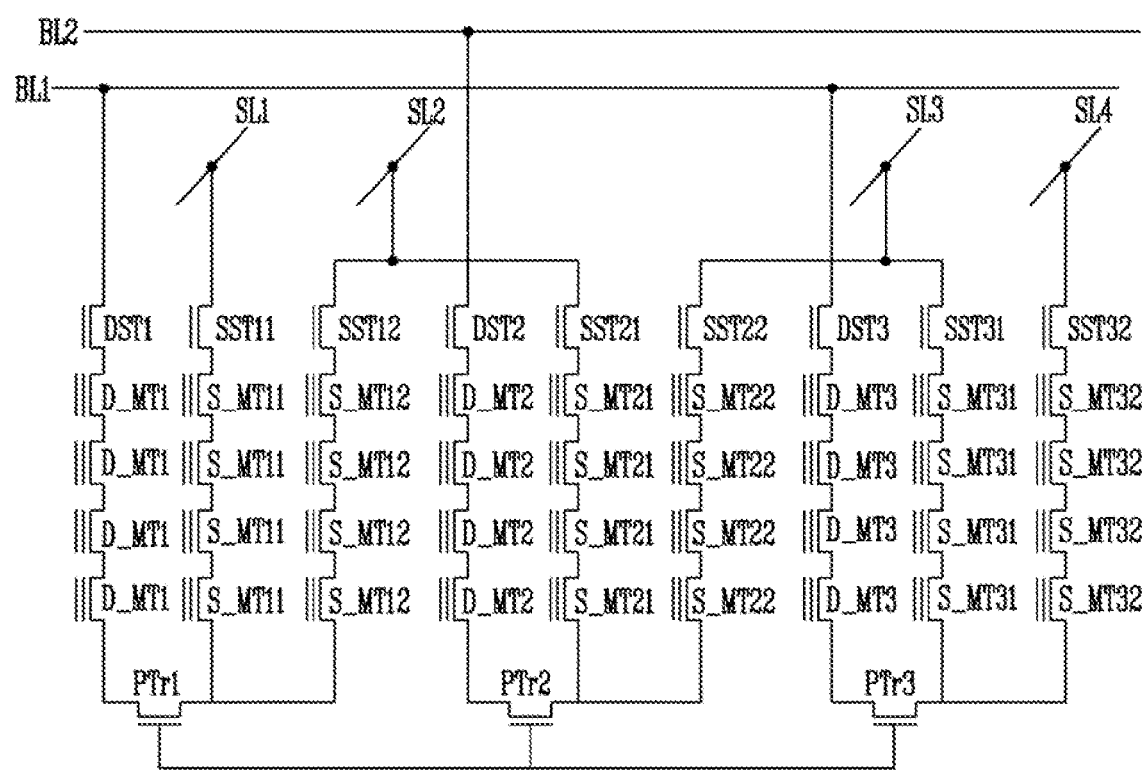

FIGS. 1B and 1C are circuit diagrams illustrating memory strings according to exemplary embodiments of the present invention.

Referring to FIG. 1B, a first memory string and a second memory string according to an exemplary embodiment of the present invention may be driven by different bit lines BL1 and BL2 and different source lines S11, S12, S21, and S22.

In the first memory string, first source-side memory transistors S_MT11 are driven by the first source line SL11 and second source-side memory transistors S_MT12 are driven by the second source line SL12. The first memory string is driven by the first bit line BL1.

In the second memory string, third source-side memory transistors S_MT21 are driven by the third source line SL21, and fourth source-side memory transistors S_MT22 are driven by the fourth source line SL22. The second memory string is driven by the second bit line BL2.

Here, the first memory string and the second memory string may belong to one memory block or different memory blocks. When the first and second memory strings belong to one memory block a first pipe transistor PTr1 and a second pipe transistor PTr2 are driven by the same pipe gate. When the first and second memory strings belong to different memory blocks, the first pipe transistor PTr1 and the second pipe transistor PTr2 are driven by different pipe gates.

Referring to FIG. 1C, first to third memory strings according to another exemplary embodiment of the present invention may share bit lines BL1 and BL2 or source lines SL1 to SL4.

Second source-side memory transistors S_MT12 of the first memory string and third source-side memory transistors S_MT21 of the second memory string share the second source line SL2. Fourth source-side memory transistors S_MT22 of the second memory string and fifth source-side memory transistors S_MT31 of the third memory string share the third source line SL3.

Here, the first to third memory strings may be driven by different bit lines or some of the first to third memory strings may share a bit line. For example, the first and third memory strings may be driven by the first bit line BL1, and the second memory string may be driven by the second bit line BL2. In this case, first source-side memory transistor S_MT11 of the first memory string are driven by the first source line SL1 and sixth source-side memory transistors S_MT32 of the third memory string may be driven by the fourth source line SL4. As another example, the first to third memory strings are driven by first to third bit lines, respectively. In this case, the first source-side memory transistor S_MT11 of the first memory string and the sixth source-side memory transistors S_MT32 of the third memory string may share the first source line SL1.

Also, the first to third memory strings may belong to one memory block or different memory blocks. When the first to third memory strings belong to one memory block, first to third pipe transistors PTr1 to PTr3 are driven by the same pipe gate. When the first to third memory strings belong to different memory blocks, the first to third pipe transistors PTr1 to PTr3 are driven by different pipe gates.

Figure 2A:
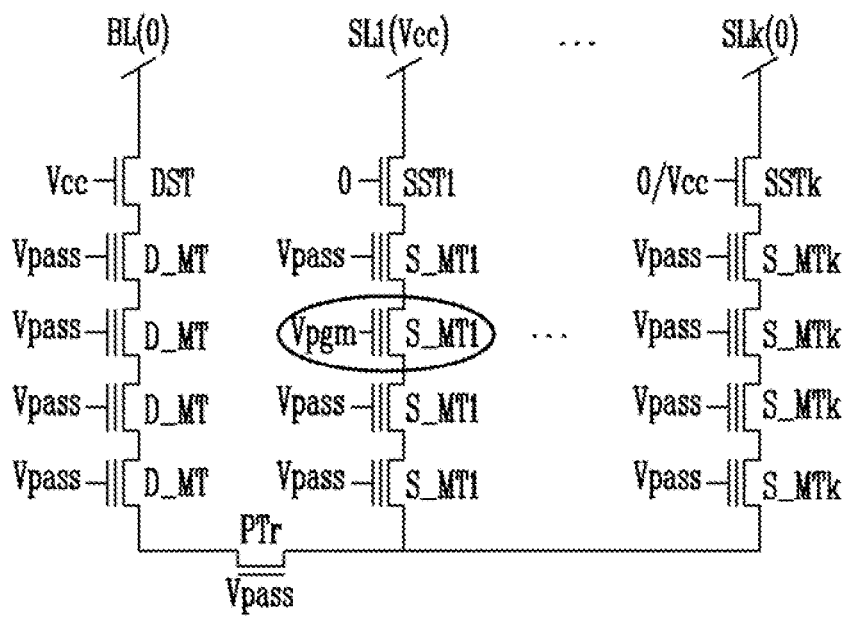
FIGS. 2A and 2B are circuit diagrams illustrating program operations performed on the memory string according to the exemplary embodiment of the present invention.
Figure 2B:
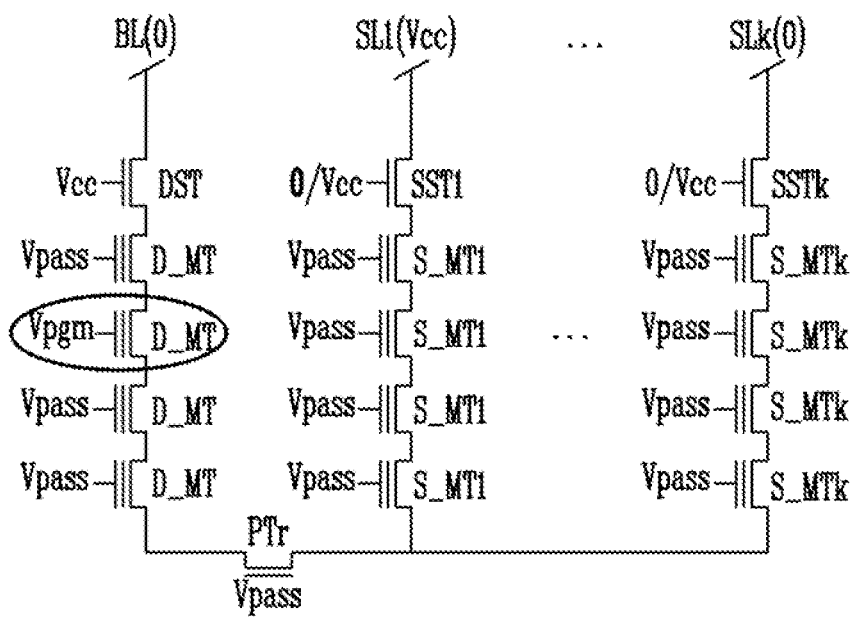

FIGS. 2A and 2B are circuit diagrams illustrating program operations performed on the memory string according to the exemplary embodiment of the present invention.

Referring to FIG. 2A, it will be described below that certain conditions of voltages are applied to respective gates of various transistors when a program operation is performed by selecting a source-side memory transistor included in the memory string according to the exemplary embodiment of the present invention.

For example, when one of first source-side memory transistors S_MT1 is selected, a program voltage Vpgm is applied to a word line connected to the selected first source-side memory transistor S_MT1 and a pass voltage Vpass is applied to the other word lines. A pass selection transistor PTr is turned on by applying the pass voltage Vpass to a gate thereof.

Also, a first source selection transistor SST1 is turned off by applying a ground voltage (0 V) to a gate thereof, and an operating voltage Vcc is applied to a first source line SL1. A drain selection transistor DST is turned on by applying the operation voltage Vcc to a gate thereof, and a bit line BL is grounded. The non-selected second to k$^{th}$ source selection transistors SST2 to SSTk are turned off or on, and second to k$^{th}$ source lines SL2 to SLk are grounded.

Referring to FIG. 2B, it will be described below that certain conditions of voltages are applied to respective gates of various transistors when a program operation is performed by selecting a drain-side transistor included in the memory string according to the exemplary embodiment of the present invention.

For example, when one of drain-side memory transistors D_MT is selected, a program voltage Vpgm is applied to a word line connected to the selected drain-side memory transistor D_MT and a pass voltage Vpass is applied to the other word lines. A pass selection transistor PTr is turned on by applying the pass voltage Vpass to a gate thereof.

Also, one of first to k$^{th}$ source selection transistors SST1 to SSTk, for example, a first source selection transistor SST1, is selected and turned off by applying a ground voltage (0 V) to a gate thereof, and an operating voltage Vcc is applied to a first source line SL1 of the first source selection transistor SST1. A drain selection transistor DST is turned on by applying the operating voltage Vcc to a gate thereof, and a bit line BL is grounded. The non-selected second to k$^{th}$ source selection transistors SST2 to SSTk are turned off or on, and second to k$^{th}$ source lines SL2 to SLk are grounded.

Figure 3A:
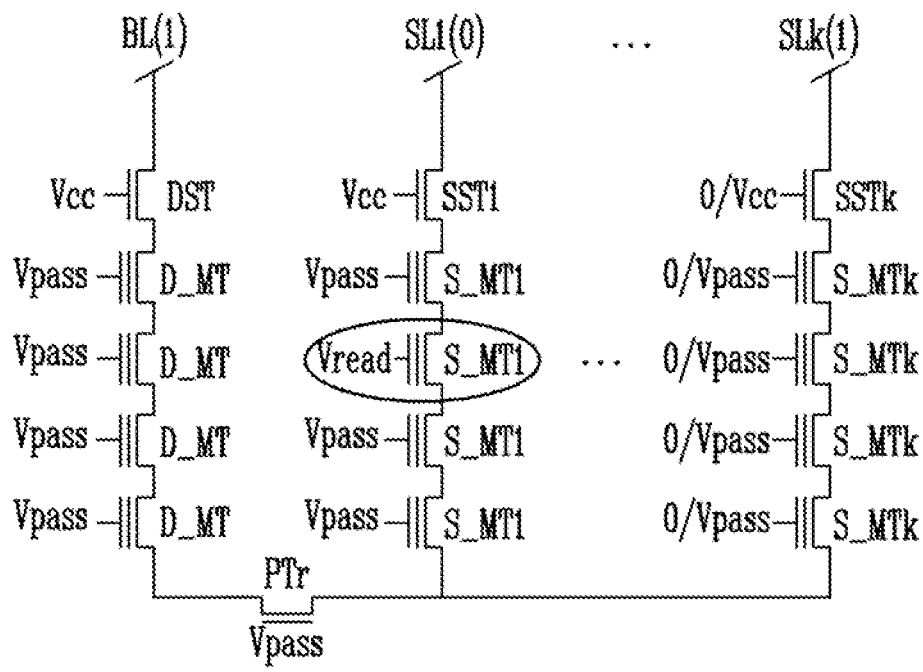
FIGS. 3A and 3B are circuit diagrams illustrating read operations performed on the memory string according to the exemplary embodiment of the present invention.
Figure 3B:
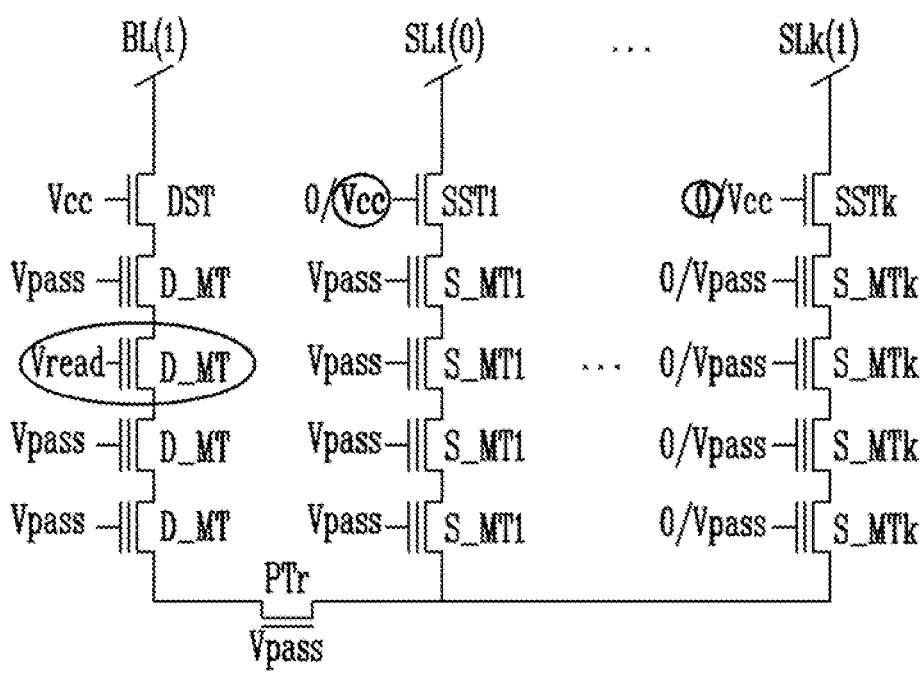

FIGS. 3A and 3B are circuit diagrams illustrating read operations performed on the memory string according to the exemplary embodiment of the present invention.

Referring to FIG. 3A, it will be described below that certain conditions of voltages are applied to respective gates of various transistors when the read operation is performed by selecting a source-side memory transistor included in the memory string according to the exemplary embodiment of the present invention.

For example, when one of first source-side memory transistors S_MT1 is selected, a read voltage Vread is applied to a gate of the selected first source-side memory transistor S_MT1 and a pass voltage Vpass is applied to gates of the other first source-side memory transistors S_MT1. Also, the pass voltage Vpass is applied to gates of drain-side memory transistors D_MT. Here, the read voltage Vread is applied to read data stored in a selected memory transistor, and has such a level that it causes a programmed memory transistor to be turned off and an erased memory transistor to be turned on. Also, the pass voltage Vpass has such a level that it causes a memory transistor to be turned on regardless of a state of the memory transistor.

Also, a drain selection transistor DST and a selected first source selection transistor SST1 are turned on by applying an operating voltage Vcc to gates thereof, a bit line BL is precharged to a high level (e.g., the operating voltage Vcc), and a selected first source line SL1 is maintained at a low level (e.g., a ground voltage). In this case, a current does not flow to the first source line SL1 when the selected first source-side memory transistor S_MT1 is in a programmed state, and it flows to the first source line SL1 when the selected first source-side memory transistor S_MT1 is in an erased state. Thus, data stored in the selected first source-side memory transistor S_MT1 is read by sensing a level of a bit line BL.

The ground voltage (0 V) or the pass voltage Vpass is applied to gates of the second to $k^{th}$ source-side memory transistors S_MT2 to S_MTk that are not selected, and the ground voltage (0 V) or the operating voltage Vcc is applied to gates of the second to $k^{th}$ source selection transistors SST2 to SSTk that are not selected. Also, the second to $k^{th}$ source lines SL2 to SLk that are not selected are maintained at a high level.

Referring to FIG. 3B, it will be described below that certain conditions of voltages are applied to respective gates of various transistors when a read operation is performed by selecting a drain-side memory transistor included in the memory string according to the exemplary embodiment of the present invention.

For example, when one of drain-side memory transistors D_MT is selected, a read voltage Vread is applied to a gate of the selected drain-side memory transistor D_MT and a pass voltage Vpass is applied to the other drain-side memory transistors D_MT.

One of first to $k^{th}$ source lines SL1 to SLk, for example, a first source line SL1 is selected, an operating voltage Vcc is applied to a gate of a first source selection transistor SST1 connected to the first source line SL1, and the pass voltage Vpass is applied to gates of the first source-side memory transistors S_MT1.

Also, a drain selection transistor DST is turned on by applying the operating voltage Vcc to a gate thereof, a bit line BL is precharged to a high level (e.g., the operating voltage Vcc), and the first source line SL1 is maintained at a low level (e.g., the ground voltage). In this case, a current does not flow to the first source line SL1 when the selected drain-side memory transistor D_MT is in a programmed state, and it flows to the first source line SL1 when the selected drain-side memory transistor D_MT is in an erased state. Thus, data stored in the selected drain-side memory transistor D_MT is read by sensing a level of the bit line BL.

The ground voltage (0 V) or the pass voltage Vpass is applied to gates of the non-selected second to $k^{th}$ source-side memory transistors S_MT2 to S_MTk, and the ground voltage (0 V) or the operating voltage Vcc is applied to gates of the non-selected second to $k^{th}$ source selection transistors SST2 to SSTk. Also, the non-selected second to $k^{th}$ source lines SL2 to SLk are maintained at a high level.

Figure 4A:
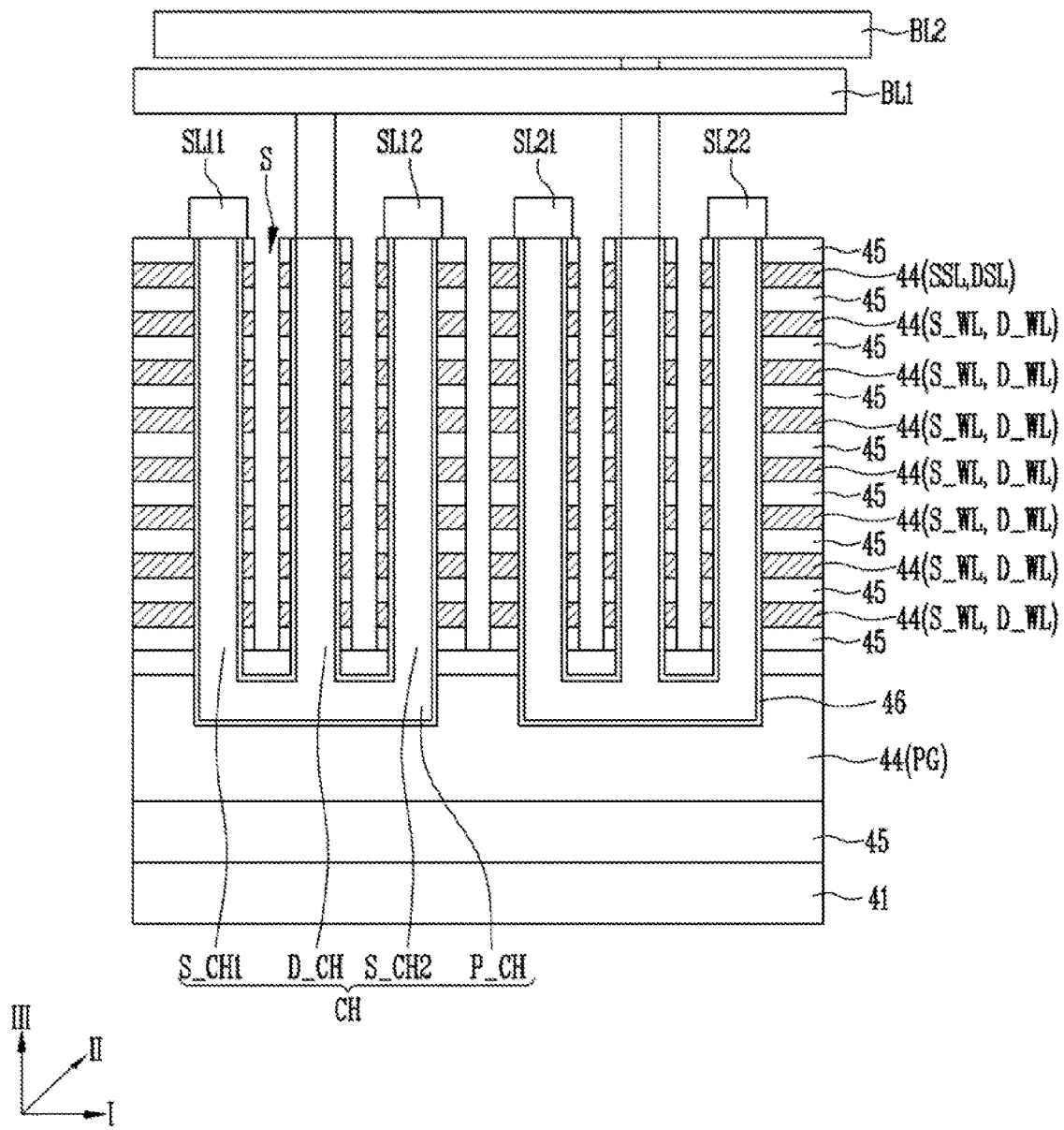
FIGS. 4A to 4C are cross-sectional views of semiconductor devices including memory strings according to exemplary embodiments of the present invention.

FIG. 4A is a cross-sectional view of a semiconductor device including memory strings according to a first exemplary embodiment of the present invention. In the present embodiment, it will be described below that a first memory string and a second memory string are driven by different bit lines and different source lines.

Referring to FIG. 4A, the semiconductor device according to the first exemplary embodiment of the present invention includes a plurality of channel layers CH. Each of the channel layers CH includes a pipe channel layer P_CH, a drain-side channel layer D_CH, and first to $k^{th}$ source channel layers S_CH1 to S_CHk. Here, 'k' denotes an integer that is equal to or greater than '2'.

The pipe channel layer P_CH connects the drain-side channel layer DCH and the first to $k^{th}$ source channel layers S_CH1 to S_CHk. For example, the pipe channel layer P_CH connects the first source-side channel layer S_CH1, the drain-side channel layer D_CH, and the second source-side channel layer S_CH2 that are arranged in a first direction I in the order listed. Here, the order in which the first source-side channel layer S_CH1, the drain-side channel layer DCH, and the second source-side channel layer S_CH2 are arranged may be changed.

Also, the channel layers CH are arranged in the first direction I and a second direction II crossing the first direction I. For example, the channel layers CH may be arranged in the form of matrix or arranged in a zigzag pattern to improve the degree of integration.

The semiconductor device according to the first exemplary embodiment of the present invention includes conductive layers 44 and insulating layers 45 that are alternately stacked on a substrate (SUB) 41. The conductive layers 44 and the insulating layers 45 are patterned by slits 5, and the conductive layers 44 may be used as a gate. For example, among the conductive layers 44, the lowermost conductive layer 44 may be a pipe gate PG, at least one uppermost conductive layer 44 may be selection lines SSL and DSL, and the other conductive layers 44 may be word lines S_WL and D_WL. Here, the conductive layers 44 are stacked while surrounding the channel layers CH. For example, the pipe gate PG wraps the pipe channel layers P_CH. The source-side word lines S_WL and the source selection lines SSL are stacked while surrounding the source-side channel layers S_CH and the drain-side word lines D_WL and the drain selection lines DSL are stacked while surrounding the drain-side channel layers D_CH.

The semiconductor device according to the first exemplary embodiment of the present invention further includes a memory layer 46 disposed between the channel layers CH and the word lines S_WL and D_WL. The memory layer 46 may include a tunnelInsulating layer, a data storage layer, and a charge blocking layer. For example, the data storage layer includes a trapping layer such as a nitride layer, a polysilicon layer, nano dots, a phase-change material layer, etc.

The semiconductor device according to the first exemplary embodiment of the present invention further includes source lines SL11, SL12, S21, and 522 connected to the source-side channel layers S_CH and bit lines BL1 and BL2 connected to the drain-side channel layers D_CH. The source lines SL11, SL12, S21, and S22 and the bit lines BL1, BL2 may extend in a direction in which they intersect each other.

In the structure described above, drain selection transistors DST are formed in regions in which the channel layers CH and the drain selection lines DSL intersect one another, and source selection transistors SST are formed in regions in which the channel layers CH and the source selection lines SSL intersect one another. Source-side memory transistors S_MT are formed in regions in which the channel layers CH and the source-side word lines S_WL intersect one another, and drain-side memory transistors D_MT are formed in regions in which the channel layers CH and the drain-side word lines D_WL intersect one another.

Thus, a pipe transistor, a plurality of drain-side memory transistors, and at least one drain selection transistor that are connected in series to a drain terminal of the pipe transistor, and a plurality of source-side memory transistors and at least one source selection transistor that are connected in parallel to a source terminal of the pipe transistor, form one memory string together, and memory strings may be arranged in the form of W.

As described above, the degree of memory integration may be improved by increasing the number of memory transistors to be included in one memory string and decreasing the number of slits S, compared to the related art.

Figure 4B:
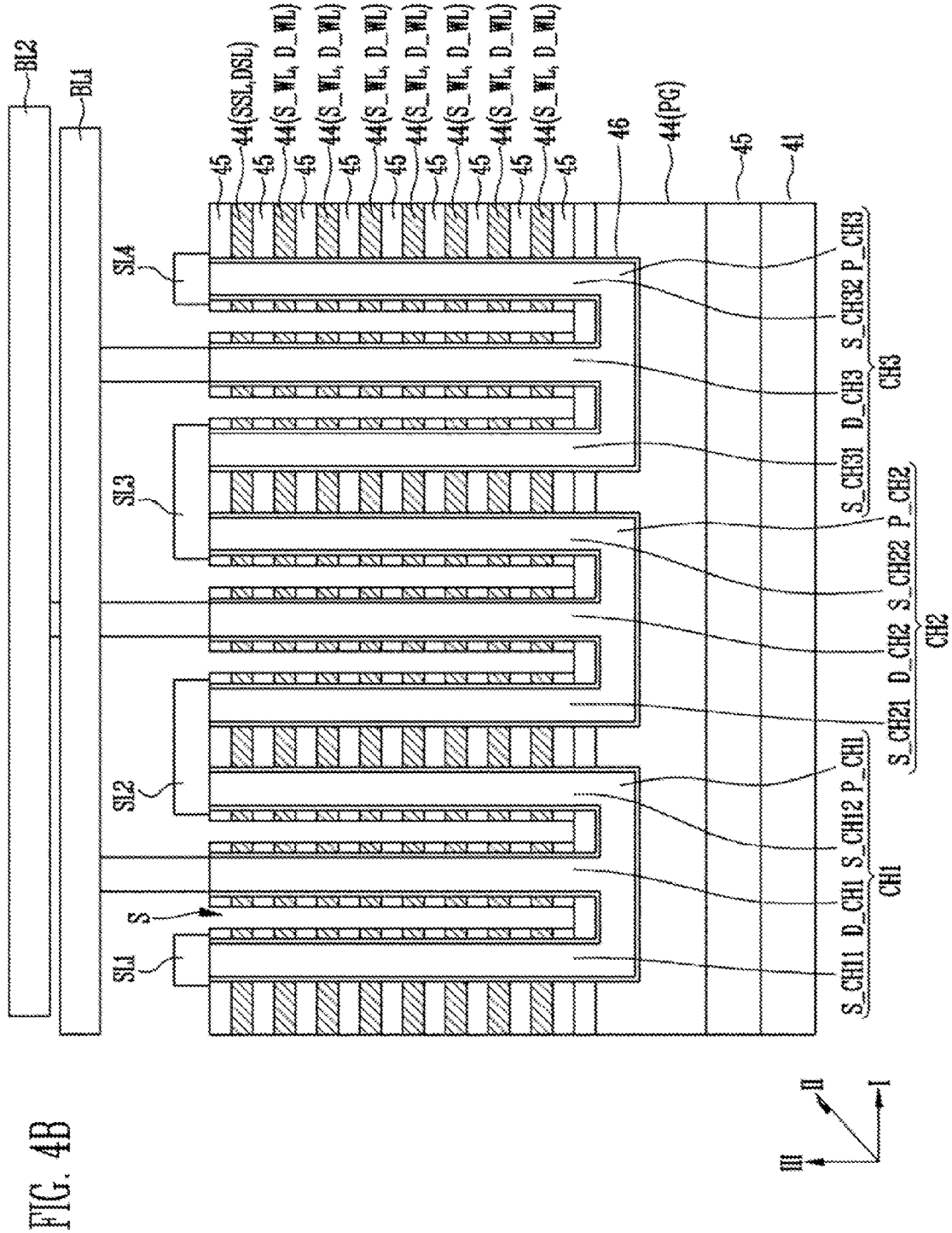

FIG. 4B is a cross-sectional view of a semiconductor device to which memory strings according to a second exemplary embodiment of the present invention. In the present embodiment, it will be described below that first to third memory strings share bit lines or source lines. Features of the semiconductor device of FIG. 4B that are the same as the previous embodiments will not be redundantly described here.

Referring to FIG. 4B, the semiconductor device according to the second exemplary embodiment of the present invention includes a plurality of channel layers CH1 to CH3. For example, the first channel layer CH1 includes a first pipe channel layer P_CH1, a first source-side channel layer S_CH11, a second source-side channel layer S_CH12, and a first drain-side channel layer D_CH1. The second and third channel layers CH2 and CH3 may have the same structure as the first channel layer CH1. The first to third channel layers CH1 to CH3 are sequentially arranged in a first direction I.

The semiconductor device according to the second exemplary embodiment of the present invention further includes conductive layers 44 and insulating layers 45 that are alternately stacked on a substrate 41. The conductive layers 44 include a pipe gate PG, source and drain-side word lines S_WL and D_WL, and source and drain selection lines SSL and DSL.

The semiconductor device according to the second exemplary embodiment of the present invention further includes a memory layer 46 disposed between the channel layers CH1 to CH3 and the word lines S_WL and D_WL.

The semiconductor device according to the second exemplary embodiment of the present invention further includes source lines SL1 to SL4 connected to the source-side channel layers S_CH and bit lines BL1 and BL2 connected to the drain-side channel layers D_CH.

For example, the first and third channel layers CH1 and CH3 are connected to the first bit line BL1, and the second channel layer CH2 is connected to the second bit line BL2. In this case, the first source-side channel layer S_CH11 is connected to the first source line SL1, the second source-side channel layer S_CH12 and a third source-side channel layer S_CH21 are connected to the second source line SL2, a fourth source-side channel layer S_CH22 and a fifth source-side channel layer S_CH31 are connected to the third source line SL3, and a sixth source-side channel layer S_CH32 is connected to the fourth source line SL4.

As another example, the first to third channel layers CH1 to CH3 are connected to the first to third bit lines BL1 to BL3, respectively (not shown). In this case, the first source-side channel layer S_CH11 and the sixth source-side channel layer S_CH32 share the first source line SL1, the second source-side channel layer S_CH12 and the third source-side channel layer S_CH21 share the second source line SL2, and the fourth source-side channel layer S_CH22 and the fifth source-side channel layer S_CH31 share the third source line SL3.

In the structure described above, second source-side memory transistors S_MT12 and third source-side memory transistors S_MT21 share the source-side word lines S_WL, respectively. Also, fourth source-side memory transistors S_MT22 and fifth source-side memory transistors S_MT31 share the source-side word lines S_WL, respectively. Thus, the number of slits is reduced to decrease a cell area, compared to the embodiment described above with reference to FIG. 4A. Also, since the conductive layers 44 stacked increase in width, stacks may be prevented from being tilted during a fabrication process.

Figure 4C:
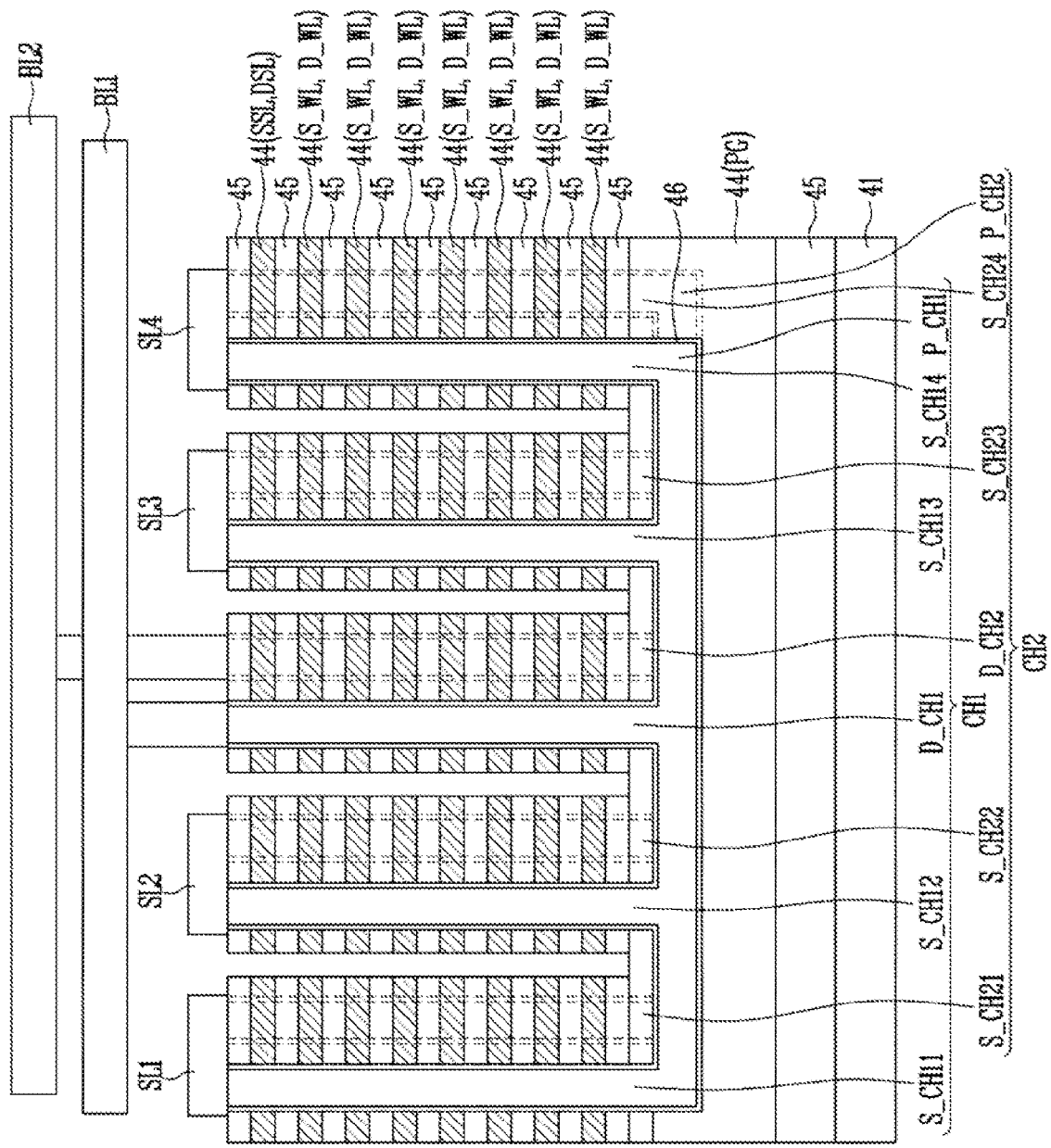

FIG. 4C is a cross-sectional view of a semiconductor device including memory strings according to a third exemplary embodiment of the present invention. In the present embodiment, it will be described below that one string includes first to fourth source-side memory transistors. Features of the semiconductor device of FIG. 4C that are the same as the previous embodiments will not be redundantly described here.

Referring to FIG. 4C, the semiconductor device according to the third exemplary embodiment of the present invention includes a plurality of channel layers CH1 and CH2. For example, each of the channel layers CH1 and CH2 includes a pipe channel layer P_CH, first to fourth source-side channel layers S_CH and a drain-side channel layer D_CH. For example, a pipe channel layer P_CH1 connects a first source-side channel layer S_CH11, a second source-side channel layer S_CH12, a drain-side channel layer D_CH1, a third source-side channel layer S_CH13, and a fourth source-side channel layer S_CH14 that are arranged in a first direction I in the order listed.

Here, the first channel layer CH1 and the second channel layer CH2 are arranged in a second direction II crossing the first direction I. For example, the first channel layer CH1 and the second channel layer CH2 are arranged in a zigzag pattern such that the center axis thereof are oblique to the second direction II with an offset.

The semiconductor device according to the third exemplary embodiment of the present invention further includes conductive layers 44 and insulating layers 45 that are alternately stacked on the substrate 41. The conductive layers 44 includes a pipe gate PG, source and drain-side word lines S_WL and D_WL, and source and drain selection lines SSL and DSL.

The semiconductor device according to the third exemplary embodiment of the present invention further includes a memory layer 46 disposed between the channel layers CH1 and CH2 and the word lines S_WL and D_WL.

The semiconductor device according to the third exemplary embodiment of the present invention further includes source lines SL1 to SL4 connected to the source-side channel layers S_CH, and bit lines BL1 and BL2 connected to the drain-side channel layers D_CH. In the first channel layer CH1 and the second channel layer CH2, first source-side channel layers S_CH11 and S_CH21 share the first source line SL1, second source-side channel layers S_CH12 and S-CH22 share the second source line SL2, third source-side channel layers S_CH13 and S_CH23 share the third source line SL3, and fourth source-side channel layers S_CH14 and S_CH24 share the fourth source line SL4.

In the structure described above, the first and second channel layers CH1 and CH2 arranged in the zigzag pattern share the first to fourth source lines SL1 to SL4, thereby reducing the number of a Tires. Also, only one memory string is formed in one memory block in the first direction I, thereby reducing disturbances during a program operation.

Figure 5:
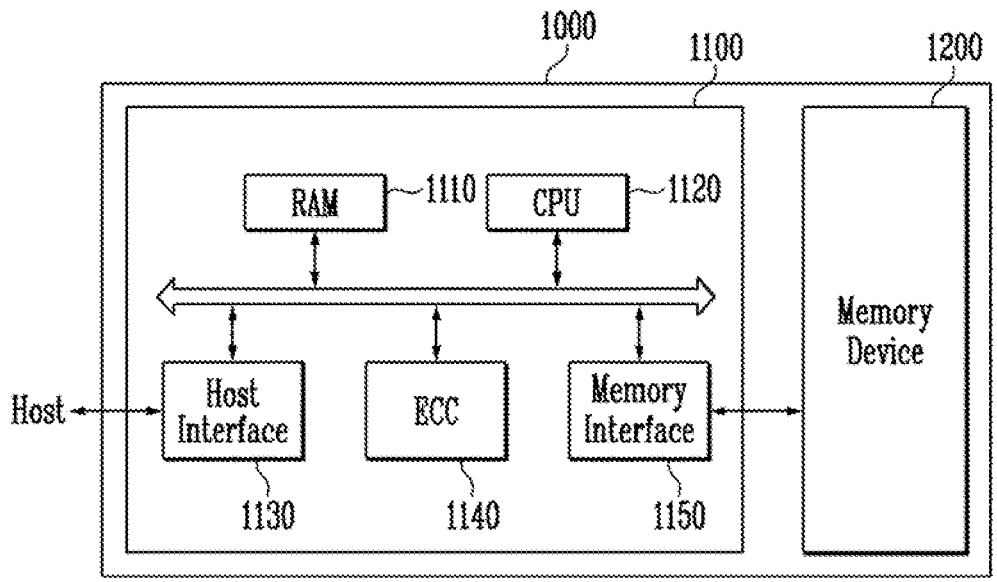
FIG. 5 is a block diagram of a memory system according to an exemplary embodiment of the present invention.

FIG. 5 is a block diagram of the structure of a memory system 1000 according to an exemplary embodiment of the present invention.

As illustrated in FIG. 5, the memory system 1000 according to the present embodiment includes a memory device 1200 and a controller 1100.

The memory device 1200 is used to store various types of data such as texts, graphics, software codes, etc. The memory device 1200 may be a non-volatile memory device and include memory strings as described above with reference to FIGS. 1A to 4C. Also, the memory device 1200 may include a pass transistor, drain-side memory transistors connected in series to a drain terminal of the pass transistor, and first to $k^{th}$ source-side memory transistors connected in parallel to a source terminal of the pass transistor. Here, 'k' denotes an integer that is equal to or greater than '2'. The structure and method of fabricating the memory device 1200 are the same as described above and are not redundantly described here.

The controller 1100 is connected to a host and the memory device 1200, and may access the memory device 1200 in response to a request from the host. For example, the controller 1100 may control read, write, erase, background operations, etc. of the memory device 1200.

The controller 1100 includes a random access memory (RAM) 1110, a central processing unit (CPU) 1120, a host interface 1130, an error correction code (ECC) circuit 1140, a memory interface 1150, etc.

Here, the RAM 1110 may be used as an operating memory of the CPU 1120, a cache memory between the memory device 1200 and the host, a buffer memory between the memory device 1200 and the host, etc. The RAM 1110 may be replaced with a static random access memory (SRAM), a read-only memory (ROM), etc.

The CPU 1120 may control overall operations of the controller 1100. For example, the CPU 1120 may operate a firmware such as a flash transition layer (FTL) stored in the RAM 1110.

The host interface 1130 may interface with the host. For example, the controller 1100 communicates with the host via at least one among various interface protocols, such as a Universal Serial Bus (USB) protocol, a MultiMedia Card (MMC) protocol, a Peripheral Component Interconnection (PCI) protocol, a PCI-Express (PCI-E) protocol, an Advanced Technology Attachment (ATA) protocol, a serial-ATA protocol, a parallel-ATA protocol, a Small Computer Small Interface (SCSI) protocol, an Enhanced Small Disk Interface (ESDI) protocol, an Integrated Drive Electronics (IDE) protocol, a private protocol, etc.

The ECC circuit 1140 may detect and correct an error in data read from the memory device 1200 using the ECC.

The memory interface 1150 may interface with the memory device 1200. For example, the memory interface 1150 includes a NAND or a NOR interface.

Alternatively, the controller 1100 may further include a buffer memory (not shown) for temporarily storing data. The buffer memory may be used to temporarily store data transmitted to the outside via the host interface 1130 or data transmitted from the memory device 1200 via the memory interface 1150. The controller 1100 may further include a ROM for storing code data used to interface with the host.

As described above, the memory system 1000 according to an exemplary embodiment of the present invention includes the memory device 1200 improved in cell current and interference characteristics, and may thus have improved characteristics.

Figure 6:
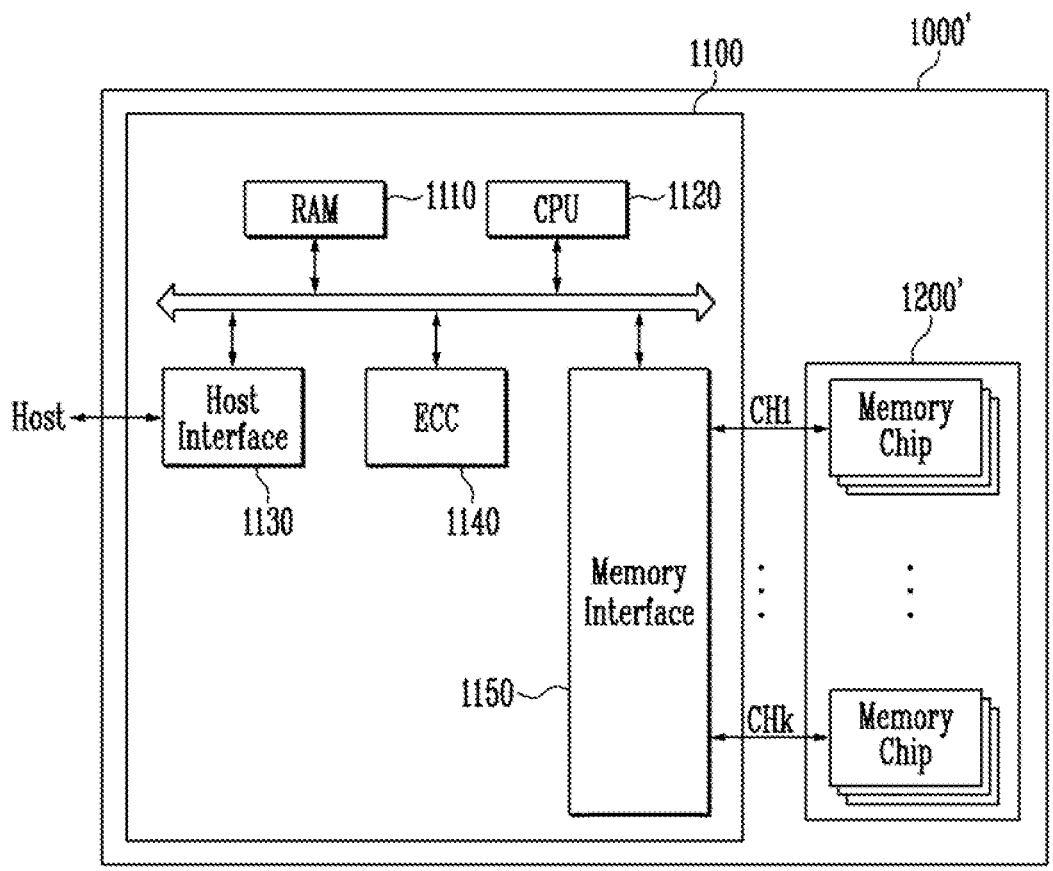
FIG. 6 is a block diagram of a memory system according to another exemplary embodiment of the present invention.

FIG. 6 is a block diagram of a memory system 1000' according to another exemplary embodiment of the present invention. The features of the memory system 1000' of FIG. 6 that are the same as the previous embodiments will not be redundantly described here.

As illustrated in FIG. 6, the memory system 1000' according to another exemplary embodiment of the present invention includes a memory device 1200' and a controller 1100. The controller 1100 includes a RAM 1110, a CPU 1120, a host interface 1130, an ECC circuit 1140, a memory interface 1150, etc.

The memory device 1200' may be a non-volatile memory and include memory strings as described above with reference to FIG. 1A to 4C. Also, the memory device 1200' includes a pass transistor, drain-side memory transistors connected in series to a drain terminal of the pass transistor, and first to $k^{th}$ source-side memory transistors connected in parallel to a source terminal of the pass transistor. Here, 'k' denotes an integer that is equal to or greater than '2'. A structure of and a method of fabricating the memory device 1200' are the same as described above and will not be described here in detail.

The memory device 1200' may be a multi-chip package including a plurality of memory chips. The plurality of memory chips are divided into a plurality of groups. The plurality of groups may communicate with the controller 1100 via first to $k^{th}$ channels CH1 to CHk. Also, memory chips belonging to one of the plurality of groups may communicate with the controller 1100 via a common channel. Alternatively, the memory system 1000' may be modified such that one memory chip is connected to one channel.

As described above, the memory system 1000' according to another exemplary embodiment of the present invention includes the memory device 1000' improved in cell current and interference characteristics and may thus have unproved characteristics. In particular, when the memory device 1200' is configured as a multi-chip package, the data storage capacity and operating speed of the memory system 1000' may be improved.

Figure 7:
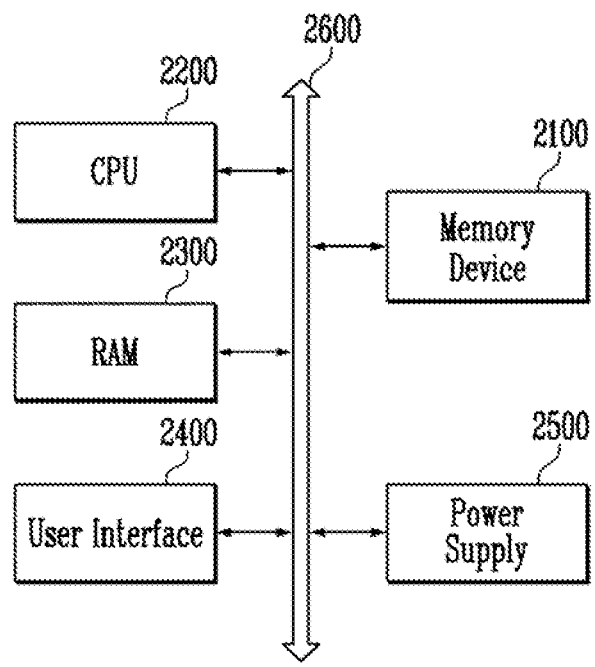
FIG. 7 is a block diagram of a computing system according to an exemplary embodiment of the present invention.

FIG. 7 is a block diagram illustrating a configuration of a computing system 2000 according to an exemplary embodiment of the present invention. The features of the computing system 2000 of FIG. 7 that are the same as the previous embodiments will not be redundantly described here.

As illustrated in FIG. 7, the computing system 2000 according to an exemplary embodiment of the preset invention includes a memory device 2100, a CPU 2200, a RAM 2300, a user interface 2400, a power supply 2500, a system bus 2600, etc.

The memory device 2100 stores data provided from the user interface 2400, data processed by the CPU 2200, etc. Also, the memory device 2100 is electrically connected to the CPU 2200, the RAM 2300, the user interface 2400, the power source 2500, etc. via the system bus 2600. For example, the memory device 2100 may be connected to the system bus 2600 directly or via a controller (not shown). When the memory device 2100 is connected directly to the system bus 2600, the functions of the controller may be performed using the CPU 2200, the RAM 2300, etc.

The memory device 2100 may be a non-volatile memory and include memory strings as described above with reference to FIGS. 1A to 4C. The memory device 2100 further includes a pass transistor, drain-side memory transistors connected in series to a drain terminal of the pass transistor, and first to $k^{th}$ source-side memory transistors connected in parallel to a source terminal of the pass transistor. Here, 'k' denotes an integer that is equal to or greater than '2'. A structure of and a method of fabricating the memory device 2100 are the same as described above and will not be described here in detail.

Also, the memory device 2100 may be a multi-chip package including a plurality of memory chips as described above with reference to FIG. 6.

The computing system 2000 having the structure described above may be a computer, a Ultra Mobile Personal Computer (UMPC), a workstation, a net-book, a Personal Digital Assistants (PDA), a portable computer, a web tablet, a wireless phone, a mobile phone, a smart phone, an e-book, a Portable Multimedia Player (PMP), a portable game console, a navigation device, a black box, a digital camera, a 3-dimensional (3D) television, a digital audio recorder, a digital audio player, a digital picture recorder, a digital picture player, a digital video recorder, a digital video player, an apparatus capable of transmitting/receiving information in a wireless environment, one of various electronic devices that form a home, computer, a telematics network, a radio-frequency identification (RFID) device, etc.

As described above, the computing system 2000 according to an exemplary embodiment of the present invention includes the memory device 2100 improved in cell current and interference characteristics and may thus have improved characteristics.

Figure 8:
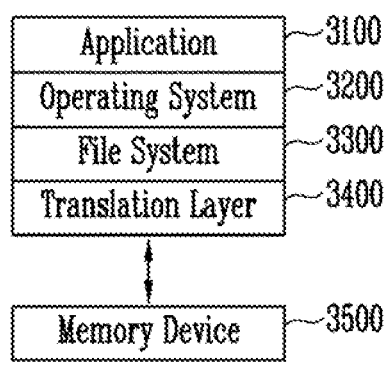
FIG. 8 is a block diagram of a computing system according to another exemplary embodiment of the present invention.

FIG. 8 is a block diagram of a computing system 3000 according to another exemplary embodiment of the present invention.

As illustrated in FIG. 8, the computing system 3000 according to another exemplary embodiment of the present invention includes a software layer including an operating system 3200, an application 3100, a file system 3300, a translation layer 3400, etc. The computing system 3000 further includes a hardware layer such as a memory device 3500.

The operating system 3200 may manage software and hardware resources, etc. of the computing system 3000, and is capable of controlling execution of a program of a CPU (not shown). The application 3100, as various programs that may be performed by the computing system 3000, may be a utility performed by the operating system 3200.

The file system 3300 means a logical structure used to manage data, files, etc. that are present in the computing system 3000, and systemize files or data to be stored in the memory device 3500 according to a rule. The file system 3300 may be determined by the operating system 3200 used in the computing system 3000. For example, when the operating system 3200 is Windows by Microsoft, the file system 3300 may be a file allocation table (FAT), an NT file system (NTFS), etc. When the operating system 3200 is Unix/Linux, the file system 3300 may be an extended file system (EXT), a Unix file system (UFS), a journaling file system (JFS) etc.

Although the operating system 3200, the application 3100, and the file system 3300 are illustrated as separate blocks in FIG. 8, the application 3100 and the file system 3300 may be included in the operating system 3200.

The translation layer 3400 translates an address into a form suitable for the memory device 3500 in response to a request from the file system 3300. For example, the translation layer 3400 translates a logic address generated by the file system 3300 into a physical address of the memory device 3500. Here, mapping information between the logic address and the physical address may be stored in the form of an address translation table. For example, the translation layer 3400 may be a flash translation layer (FTL), a universal flash storage link layer (ULL), etc.

The memory device 3500 may be a non-volatile memory and include memory strings as described above with reference to FIGS. 1A to 4C. Also, the memory device 3500 may further include a pass transistor, drain-side memory transistors connected in series to a drain terminal of the pass transistor, and first to $k^{th}$ source-side memory transistors connected in parallel to a source terminal of the pass transistor. Here, 'k' denotes an integer that is equal to or greater than '2'. The structure and method of fabricating the memory device 3500 are the same as described above and are not described here in detail.

The computing system 3000 having the structure described above may be divided into an operating system layer implemented in an upper-level region and a controller layer implemented in a lower-level region. Here, the application 3100, the operating system 3200, and the file system 3300 may be included in the operating system layer, and driven by an operating memory of the computing system 3000. The translation layer 3400 may be included in the operating system layer or the controller layer.

As described above, the computing system 3000 according to another exemplary embodiment of the present invention includes the memory device 3500 improved in cell current and interference characteristics and may thus have improved characteristics.

As described above, each of memory strings includes first to $k^{th}$ source-side memory transistors connected in parallel to a source terminal of a pipe transistor. Also, each of the memory strings is connected to a plurality of source lines. Thus, the integration degree and cell current characteristics of a semiconductor device may be improved. Also, the characteristics of the semiconductor device may be improved by reducing interferences between memory cells.

In the drawings and specification, there have been disclosed typical exemplary embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A memory string comprising:
    a pass transistor;
    first memory cells connected in series to a drain terminal of the pass ransistor; and
    first to $k^{th}$ memory cell groups connected in parallel to a source terminal of the pass transistor and each including a plurality of second memory cells connected in series, wherein k denotes an integer that is equal to or greater than '2'.

2. The memory string of claim 1, further comprising:
    a drain selection transistor connected between the first memory cells and a bit line; and
    first to $k^{th}$ source selection transistors connected between the first to $k^{th}$ memory cell groups and first to $k^{th}$ source lines, respectively.

3. The memory string of claim 2, wherein, when a second memory cell of one of the first to $k^{th}$ memory cell groups is selected and programmed, the drain selection transistor is turned on, a source selection transistor connected to the one of the first to $k^{th}$ memory cell groups is turned off, and other source selection transistors are turned on.

4. The memory string of claim 2, wherein, when one of the first memory cells is selected and programmed, the drain selection transistor is turned on, one of the first to $k^{th}$ source selection transistors is selected and turned off, and other source selection transistors are turned on.

5. The memory string of claim 2, wherein, when a second memory cell of one of the first to $k^{th}$ memory cell groups is selected and read, the drain selection transistor is turned on, a source selection transistor connected to the one of the first to $k^{th}$ memory cell groups is turned on, and other source selection transistors are turned off.

6. The memory string of claim 2, wherein, when one of the first memory cells is selected and read, the drain selection transistor is turned on, one of the first to $k^{th}$ source selection transistors is selected and turned on, and other source selection transistors are turned off.

7. The memory string of claim 2, wherein the first to $k^{th}$ memory cell groups are driven by the first to $k^{th}$ source lines, respectively.

\* \* \* \* \*